United States Patent
Koyama et al.

(10) Patent No.: US 10,079,596 B2
(45) Date of Patent: Sep. 18, 2018

(54) SEMICONDUCTOR DEVICE, CHARGE PUMP CIRCUIT, SEMICONDUCTOR SYSTEM, VEHICLE, AND CONTROL METHOD OF SEMICONDUCTOR DEVICE

(71) Applicant: Renesas Electronics Corporation, Tokyo (JP)

(72) Inventors: Shinichi Koyama, Tokyo (JP); Takeshi Kusunoki, Tokyo (JP); Wei Zhou, Tokyo (JP); Hiromasa Suzuki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/397,765

(22) Filed: Jan. 4, 2017

(65) Prior Publication Data

US 2017/0264280 A1    Sep. 14, 2017

(30) Foreign Application Priority Data

Mar. 9, 2016  (JP) ................. 2016-045322

(51) Int. Cl.
*H03B 1/00*    (2006.01)
*H03K 3/00*    (2006.01)
(Continued)

(52) U.S. Cl.
CPC .......... *H03K 17/0822* (2013.01); *G05F 1/56* (2013.01); *H02H 11/003* (2013.01); *H02M 1/32* (2013.01);
(Continued)

(58) Field of Classification Search
CPC .. H03K 17/08; H03K 17/082; H03K 17/0822; H03K 17/0826; G05F 1/10;
(Continued)

(56) References Cited

U.S. PATENT DOCUMENTS 5,444,595 A   8/1995 Ishikawa et al.
7,656,632 B2  2/2010 Tsuchihashi
(Continued)

FOREIGN PATENT DOCUMENTS

EP   0 703 664 A2   3/1996
JP   60-112318 A    6/1985
(Continued)

OTHER PUBLICATIONS

Extended European Search Report received in corresponding European Application No. 17158951.8 dated Aug. 17, 2017.
(Continued)

*Primary Examiner* — Lincoln Donovan
*Assistant Examiner* — Diana J Cheng
(74) *Attorney, Agent, or Firm* — Mattingly & Malur, PC

(57) ABSTRACT

A semiconductor device capable of preventing deterioration of a transistor caused by a flow of an overcurrent is provided. According to an embodiment, a semiconductor chip includes a first transistor provided between a high-potential side voltage terminal to which a constant voltage generated by reducing a power-supply voltage is supplied and an output terminal, a second transistor provided between a low-potential side voltage terminal to which a ground voltage is supplied and the output terminal, a control circuit controlling turning-on/off of the first and second transistors, a boosting circuit boosting the power-supply voltage by using a voltage of the output terminal to generate an output voltage, and an overvoltage detection circuit detecting an overvoltage of a power-supply line that couples the high-potential side voltage terminal and the first transistor to each other. The control circuit performs control to turn off the second transistor, when the overvoltage has been detected.

16 Claims, 5 Drawing Sheets

(51) Int. Cl.
  *H03K 17/082* (2006.01)
  *H02M 3/07* (2006.01)
  *G05F 1/56* (2006.01)
  *H02M 1/32* (2007.01)
  *H02M 3/156* (2006.01)
  *H02M 3/18* (2006.01)
  *H02H 11/00* (2006.01)

(52) U.S. Cl.
  CPC .............. *H02M 3/07* (2013.01); *H02M 3/073* (2013.01); *H02M 3/156* (2013.01); *H02M 3/18* (2013.01)

(58) Field of Classification Search
  CPC ... G05F 1/46; G05F 1/56; G05F 1/562; G05F 1/575; H02H 11/00; H02H 11/002; H02H 11/003; H02M 1/32; H02M 3/02; H02M 3/04; H02M 3/06; H02M 3/07; H02M 3/073; H02M 3/10; H02M 3/145; H02M 3/155; H02M 3/156; H02M 3/16; H02M 3/18; H02M 2003/076

USPC .................................................. 327/108–112
  See application file for complete search history.

(56) References Cited

U.S. PATENT DOCUMENTS

| | | |
|---|---|---|
| 2002/0109952 A1 | 8/2002 | Rapsinski et al. |
| 2003/0156439 A1 | 8/2003 | Ohmichi et al. |
| 2008/0174184 A1 | 7/2008 | Arpilliere et al. |

FOREIGN PATENT DOCUMENTS

| | | |
|---|---|---|
| JP | 7-154224 A | 6/1995 |
| JP | 2007-082364 A | 3/2007 |
| JP | 2010-29009 A | 2/2010 |
| JP | 2011-78272 A | 4/2011 |

OTHER PUBLICATIONS

Communication Pursuant to Article 94(3) received in corresponding European Application No. 17 158 951.8 dated Jul. 6, 2018.

US 10,079,596 B2

SEMICONDUCTOR DEVICE, CHARGE PUMP CIRCUIT, SEMICONDUCTOR SYSTEM, VEHICLE, AND CONTROL METHOD OF SEMICONDUCTOR DEVICE

CROSS-REFERENCE TO RELATED APPLICATIONS

The disclosure of Japanese Patent Application No. 2016-045322 filed on Mar. 9, 2016 including the specification, drawings and abstract is incorporated herein by reference in its entirety.

BACKGROUND

The present invention relates to a semiconductor device, a charge pump circuit, a semiconductor system, a vehicle, and a control method of a semiconductor device, and, for example, relates to a semiconductor device, a charge pump circuit, a semiconductor system, a vehicle, and a control method of a semiconductor device that are suitable for preventing deterioration of a transistor and a wiring caused by a flow of an overcurrent.

Japanese Unexamined Patent Application Publication No. 2007-82364 discloses a configuration of a charge pump circuit. This charge pump circuit includes a constant voltage output circuit outputting a constant voltage, a control circuit, and a boosting circuit that has an input unit to which an output of the constant voltage output circuit is supplied and is switch-controlled by the control circuit. Further, the constant voltage output circuit includes an overcurrent detection circuit detecting an overcurrent in a case where a current equal to or larger than a predetermined value flows for a predetermined time period or longer, and an overcurrent protection circuit that performs an operation protecting the constant voltage output circuit based on a result of detection by the overcurrent detection circuit.

SUMMARY

In the configuration of the charge pump circuit disclosed in Japanese Unexamined Patent Application Publication No. 2007-82364, a circuit detecting that the overcurrent flows in the constant voltage output circuit is merely provided, but it is not considered whether the overcurrent flows in the control circuit that switch-controls the boosting circuit. Therefore, in a case where an output terminal of the control circuit is short-circuited to a power-supply voltage line (i.e., a power-supply fault occurs), it is not possible to detect that the overcurrent flows in the control circuit. As a result, there is a problem that a transistor and a wiring provided in the control circuit are deteriorated. Other problems and novel features will be apparent from the description of the specification of the present application and the accompanying drawings.

According to an embodiment, a semiconductor device includes: a first transistor provided between a high-potential side voltage terminal to which a constant voltage generated by reducing a power-supply voltage is supplied and a first output terminal; a second transistor provided between a low-potential side voltage terminal to which a reference voltage is supplied and the first output terminal; a control circuit that controls turning-on/off of the first and second transistors; a boosting circuit that boosts the power-supply voltage by using a voltage of the first output terminal, to generate an output voltage; and an overvoltage detection circuit that detects an overvoltage of a power-supply line coupling the high-potential side voltage terminal and the first transistor to each other. The control circuit controls at least the second transistor in such a manner that the second transistor is turned off, when the overvoltage has been detected by the overvoltage detection circuit.

According to another embodiment, a control method of a semiconductor device, includes the steps of: controlling turning-on/off of each of a first transistor that is provided between a high-potential side voltage terminal to which a constant voltage generated by reducing a power-supply voltage is supplied and a first output terminal, and a second transistor that is provided between a low-potential side voltage terminal to which a reference voltage is supplied and the first output terminal, to periodically switch a voltage of the first output terminal to the constant voltage or the reference voltage; boosting the power-supply voltage by using the voltage of the first output terminal to generate an output voltage; and controlling at least the second transistor in such a manner that the second transistor is turned off, when an overvoltage of a power-supply line that couples the high-potential side voltage terminal and the first transistor to each other has been detected.

According to the embodiment, it is possible to provide a semiconductor device, a charge pump circuit, a semiconductor system, a vehicle, and a control method of a semiconductor device that can prevent deterioration or damage of a transistor or a wiring caused by a flow of an overcurrent.

DETAILED DESCRIPTION

Figure 1:
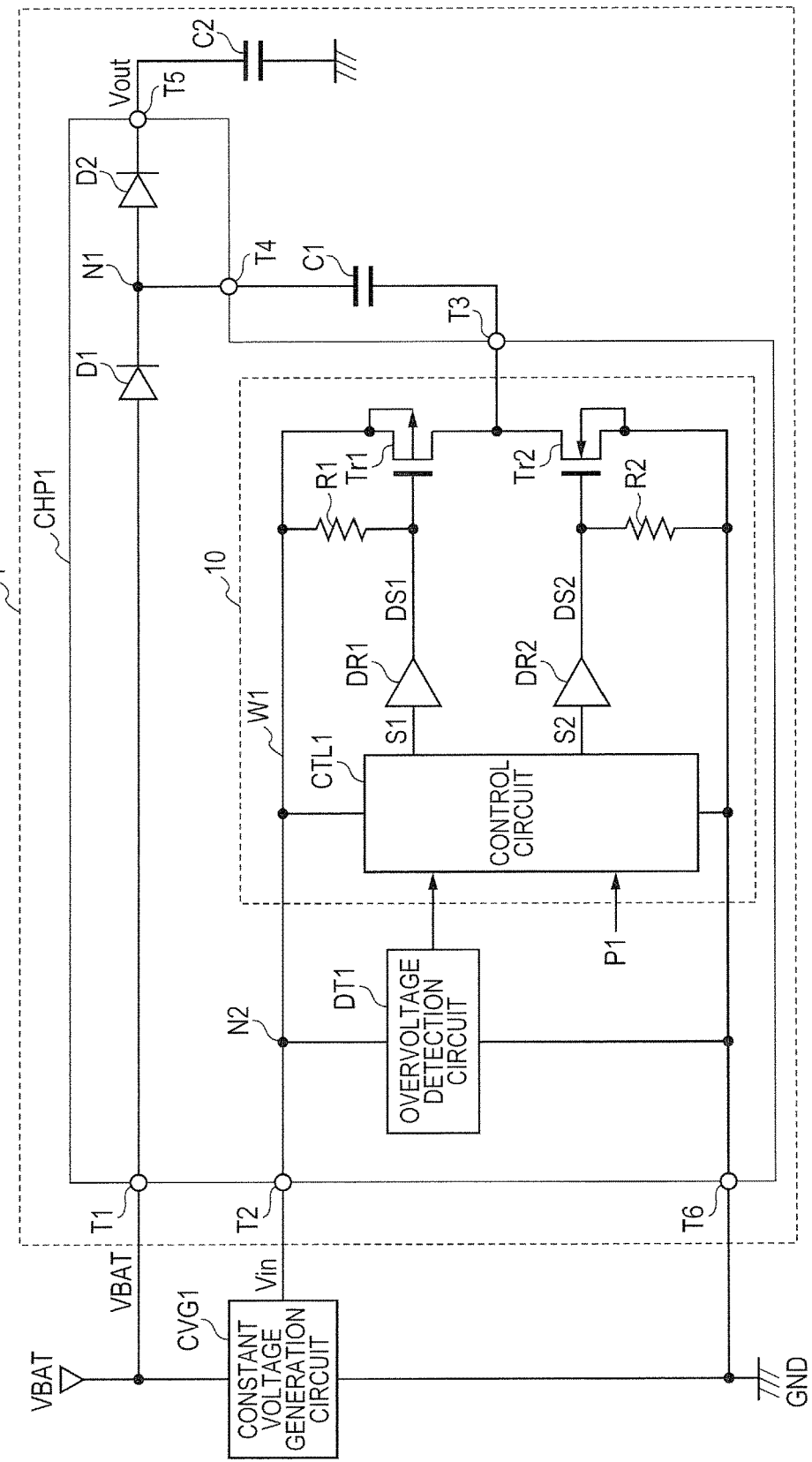
FIG. 1 illustrates a configuration example of a semiconductor system including a charge pump circuit according to a first embodiment.

Embodiments are described below, referring to the drawings. Because the drawings are simplified, a technical scope of the embodiments should not be interpreted narrowly on the basis of the description of the drawings. The same components are labeled with the same reference signs, and redundant description is omitted.

The following embodiments will be described while being divided into a plurality of sections or embodiments, if necessary for the sake of convenience. However, unless otherwise specified, these are not independent of each other, but are in a relation such that one is a modified example, an application example, detailed description, complementary explanation, or the like of a portion or the whole of the other. Further, in the following embodiments, when a reference is made to the number of elements, and the like (including number, numerical value, quantity, range, and the like), the number of elements is not limited to the specific number, but may be equal to, greater than or less than the specific number, unless otherwise specified, or except the case where the number is apparently limited to the specific number in principle, or except for other cases.

Furthermore, in the following embodiments, the constitutional elements (including operation steps, or the like) are not always essential, unless otherwise specified, or except the case where they are apparently considered essential in principle, or except for other cases. Similarly, in the following embodiments, when a reference is made to the shapes, positional relationships or the like of the constitutional elements or the like, it is understood that they include ones substantially analogous or similar to the shapes or the like, unless otherwise specified, or unless otherwise considered apparently in principle, or except for other cases. This also applies to the foregoing numbers and the like (including number, numerical value, quantity, range and the like).

First Embodiment

FIG. 1 illustrates a configuration example of a semiconductor system SYS1 including a charge pump circuit 1 according to a first embodiment. The charge pump circuit 1 and the semiconductor system SYS1 including the same according to the present embodiment include an overvoltage detection circuit for detecting an overvoltage generated by a power-supply fault of an output terminal of a driving control circuit that periodically switches a voltage applied to a capacitor element of a boosting circuit. When an overvoltage of a power-supply line W1 has been detected by the overvoltage detection circuit, transistors Tr1 and Tr2 provided in an output stage in the driving control circuit are quickly controlled to be turned off. By doing this, the charge pump circuit 1 and the semiconductor system SYS1 including the same according to the present embodiment can prevent deterioration of a transistor and a wiring caused by a flow of an overcurrent. A specific description is made below.

As illustrated in FIG. 1, the semiconductor system SYS1 includes the charge pump circuit 1 and a constant voltage generation circuit CVG1. The semiconductor system SYS1 is mounted on a vehicle, for example.

(Constant Voltage Generation Circuit CVG1)

The constant voltage generation circuit CVG1 reduces a power-supply voltage VBAT from a battery to generate a constant voltage Vin. The power-supply voltage VBAT of the battery is usually 12 V or 24 V in many cases, when the battery is mounted on a vehicle. In the present embodiment, a case where the constant voltage Vin is 7 V that is sufficiently lower than the power-supply voltage VBAT is described as an example. The power-supply voltage VBAT is used by both the charge pump circuit 1 and a peripheral circuit other than the charge pump circuit 1 (another electronic device mounted on the vehicle), and therefore may be at a very high voltage level (for example, 12 V) or may vary in a wide range (for example, 40 V at the maximum). Therefore, by using the constant voltage generation circuit CVG1, the power-supply voltage VBAT that is at the very high voltage level, for example, is reduced to a level used in the charge pump circuit 1, or the power-supply voltage VBAT of which the voltage level can vary in the wide range, for example, is made stable at the level that can be used in the charge pump circuit 1.

(Charge Pump Circuit 1)

The charge pump circuit 1 boosts the power-supply voltage VBAT to generate an output voltage Vout.

Specifically, the charge pump circuit 1 includes diodes D1 and D2, a driving control circuit 10, and an overvoltage detection circuit DT1 on a semiconductor chip (a semiconductor device) CHP1, and also includes capacitor elements C1 and C2 outside the semiconductor chip CHP1. The driving control circuit 10 includes a control circuit CTL1, gate driving circuits DR1 and DR2, transistors Tr1 and Tr2, and resistor elements R1 and R2. Further, on the semiconductor chip CHP1, external connection terminals T1 to T6 are provided along an outer periphery of the chip. The diodes D1 and D2 and the capacitor elements C1 and C2 form a boosting circuit.

To a high-potential side voltage terminal T2, which is one of the external connection terminals, the constant voltage Vin generated by the constant voltage generation circuit CVG1 is supplied. To a low-potential side voltage terminal T6, which is one of the external connection terminals, a reference voltage (a ground voltage GND in this example) is supplied.

The transistor Tr1 is a P-channel MOS transistor and is provided between the high-potential side voltage terminal T2 and an output terminal (a first output terminal) T3, which is one of the external connection terminals. The transistor Tr2 is an N-channel MOS transistor and is provided between the low-potential side voltage terminal T6 and the output terminal T3.

The resistor element R1 is provided between a gate and a source of the transistor Tr1. The resistor element R2 is provided between a gate (a control terminal) and a source (a first terminal) of the transistor Tr2.

The control circuit CTL1 is a circuit that controls turning-on/off of the transistors Tr1 and Tr2.

Specifically, the control circuit CTL1 outputs control signals S1 and S2 that periodically change to an H level or an L level in synchronization with a pulse signal P1 that periodically changes to an H level or an L level during a boosting operation.

The gate driving circuit DR1 generates a driving signal DS1 in accordance with the control signal S1 and applies the driving signal DS1 to the gate of the transistor Tr1. In this example, the gate driving circuit DR1 places its output in a high-impedance state when the control signal S1 is at the H level, and sets the driving signal DS1 at an L level when the control signal S1 is at the L level. When the output of the gate driving circuit DR1 is in the high-impedance state, the constant voltage Vin is applied to the gate of the transistor Tr1 via the resistor element R1, and therefore the transistor Tr1 is turned off. On the other hand, when the output of the gate driving circuit DR1 is at the L level, the transistor Tr1 is turned on.

The gate driving circuit DR2 generates a driving signal DS2 in accordance with the control signal S2 and applies the driving signal DS2 to the gate of the transistor Tr2. In this example, the gate driving circuit DR2 sets the driving signal DS2 at an H level when the control signal S2 is at the H level, and places its output in a high-impedance state when the control signal S2 is at the L level. When the output of the gate driving circuit DR2 is at the H level, the transistor Tr2 is turned on. On the other hand, when the output of the gate driving circuit DR2 is in the high-impedance state, the ground voltage GND is applied to the gate of the transistor Tr2 via the resistor element R2, so that the transistor Tr2 is turned off.

By this configuration, during the boosting operation, the transistors Tr1 and Tr2 are repeatedly turned on and off in a complementary manner. It is actually preferable that the transistors Tr1 and Tr2 are repeatedly turned on and off in a complementary manner with a dead time. In other words, when the transistor Tr2 is switched from an off state to an on state, it is preferable that, after the transistor Tr1 is switched from an on state to an off state and then the dead time passes, the transistor Tr2 is switched from the off state to the on state. Similarly, when the transistor Tr1 is switched from the off state to the on state, it is preferable that, after the transistor Tr2 is switched from the on state to the off state and then the dead time passes, the transistor Tr1 is switched from the off state to the on state. This configuration can prevent the transistors Tr1 and Tr2 from instantaneously being in the on state at the same time, so that deterioration or damage of the transistors Tr1 and Tr2 and a wiring caused by a flow of a throw-current can be prevented. Further, increase of a power consumption can be suppressed.

For example, in a case where the transistor Tr1 is in the on state and the transistor Tr2 is in the off state, the constant voltage Vin supplied to the high-potential side voltage terminal T2 is output from the output terminal T3. On the other hand, in a case where the transistor Tr1 is in the off state and the transistor Tr2 is in the on state, the ground voltage GND supplied to the low-potential side voltage terminal T6 is output from the output terminal T3. That is, during the boosting operation, the voltage of the output terminal T3 has either one of values of the constant voltage Vin and the ground voltage GND that are switched periodically.

To a voltage input terminal T1, which is one of the external connection terminals, the power-supply voltage VBAT from the battery is supplied. Further, from a voltage output terminal T5 that is one of the external connection terminals, an output voltage Vout is output to the outside.

The diodes D1 and D2 are provided in a forward direction from the voltage input terminal T1 to which the power-supply voltage VBAT is supplied from the outside, to the voltage output terminal T5 outputting the output voltage Vout to the outside. An external connection terminal T4 is coupled to a node N1 between the diodes D1 and D2. In the following description, forward-direction voltages of the diodes D1 and D2 are not taken into consideration for simplifying the description. Alternatively, the diodes D1 and D2 may be replaced with two transistors. In this case, it is necessary to switch the on state and the off state of the two transistors at the same timing as the timing at which the on state and the off state of the diodes D1 and D2 are switched.

The capacitor elements C1 and C2 are provided outside the semiconductor chip CHP1. Specifically, the capacitor element C1 is provided outside the semiconductor chip CHP1 between the external connection terminal T4 and the output terminal T3. The capacitor element C2 is provided outside the semiconductor chip CHP1 between the voltage output terminal T5 and a ground-voltage terminal GND.

The voltage of the output terminal T3 is applied to the node N1 between the diodes D1 and D2 via the capacitor element C1.

In the boosting operation of the charge pump circuit 1, the boosting circuit formed by the diodes D1 and D2 and the capacitor elements C1 and C2 boosts the power-supply voltage VBAT by using the output voltage of the driving control circuit 10 (the voltage of the output terminal T3) to generate the output voltage Vout.

Specifically, first, by the control circuit CTL1, the transistor Tr1 is controlled to be turned off and the transistor Tr2 is controlled to be turned on. This causes the ground voltage GND to be supplied from the low-potential side voltage terminal T6 to the output terminal T3 via the transistor Tr2. Also, the power-supply voltage VBAT is supplied from the voltage input terminal T1 to the node N1 via the diode D1. That is, the ground voltage GND is supplied to one end of the capacitor element C1, while the power-supply voltage VBAT is supplied to the other end of the capacitor element C1. Therefore, electric charges corresponding to the power-supply voltage VBAT are charged in the capacitor element C1.

Thereafter, by the control circuit CTL1, the transistor Tr1 is controlled to be turned on and the transistor Tr2 is controlled to be turned off. This causes the constant voltage Vin to be supplied from the high-potential side voltage terminal T2 to the output terminal T3 via the transistor Tr1. That is, the voltage supplied to the one end of the capacitor element C1 is switched from the ground voltage GND to the constant voltage Vin. Because the electric charges corresponding to the power-supply voltage VBAT have been charged in the capacitor element C1 at this time, the voltage at the other end of the capacitor element C1 (the voltage at the node N1) is boosted to a voltage level obtained by superimposing the constant voltage Vin on the power-supply voltage VBAT. This boosted voltage is supplied to the voltage output terminal T5 via the diode D2, and is output to the outside as the output voltage Vout. The output voltage Vout is smoothened by the capacitor element C2.

In the boosting operation of the charge pump circuit 1, these operations are repeated.

(Overvoltage Detection Circuit DT1)

The overvoltage detection circuit DT1 is a circuit that detects an overvoltage at a node N2 on the power-supply line W1 that couples the high-potential side voltage terminal T2 and the transistor Tr1 to each other. For example, in a case where the output terminal T3 is short-circuited to a power-supply VBAT line (that is, a power-supply fault occurs), a current flows from the output terminal T3 to a parasitic diode of the transistor Tr1, the power-supply line W1, and the high-potential side voltage terminal T2. Therefore, a voltage level of the power-supply line W1 exceeds the constant voltage Vin. When the voltage level of the power-supply line W1 reaches a predetermined voltage higher than the constant voltage Vin, the overvoltage detection circuit DT1 outputs a detection result indicating that an overvoltage has been generated to the control circuit CTL1.

When the overvoltage has been detected by the overvoltage detection circuit DT1, the control circuit CTL1 forcedly terminates the boosting operation and controls the transistors Tr1 and Tr2 so that both the transistors Tr1 and Tr2 are turned off. This prevents deterioration of the transistors Tr1 and Tr2 and a wiring caused by a flow of an overcurrent. In particular, it is highly likely that an extremely large current flows through the transistor Tr2, and therefore it is very effective to detect the overvoltage of the power-supply line W1 and quickly turn off the transistor Tr2.

(Specific Configuration Example of Overvoltage Detection Circuit DT1)

Figure 2:
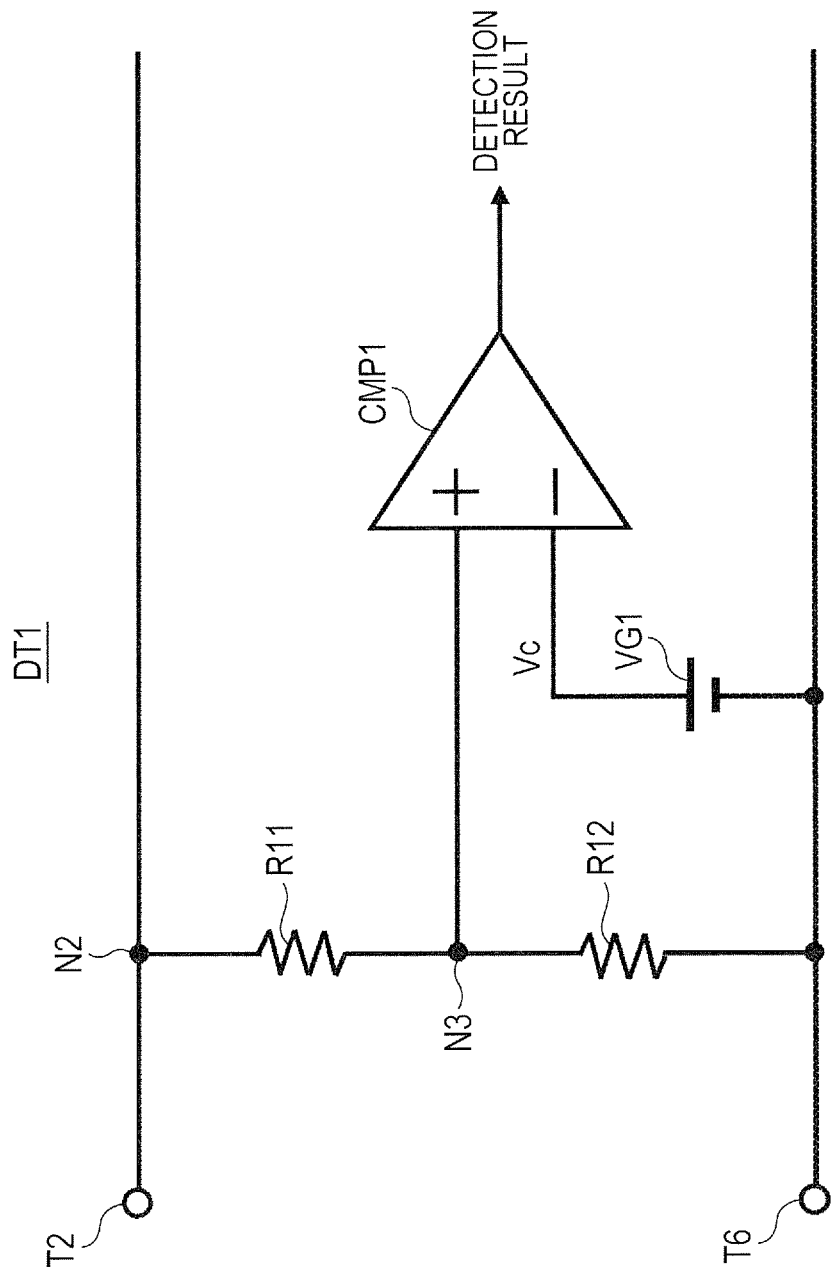
FIG. 2 illustrates a specific configuration example of an overvoltage detection circuit provided in the charge pump circuit illustrated in FIG. 1.

FIG. 2 illustrates a specific configuration example of the overvoltage detection circuit DT1.

As illustrated in FIG. 2, the overvoltage detection circuit DT1 includes resistor elements R11 and R12, a predetermined voltage supply VG1, and a comparator CMP1.

The resistor elements R11 and R12 are provided in series between the node N2 on the power-supply line W1 and the low-potential side voltage terminal T6. The comparator CMP1 compares a voltage at a node N3 between the resistor elements R11 and R12 (that is, a voltage obtained by dividing the voltage of the power-supply line W1 by the resistors) and a predetermined voltage Vc output from the predetermined voltage supply VG1 to each other. A result of comparison by the comparator CMP1 is output to the control circuit CTL1 as the detection result of the overvoltage detection circuit DT1.

For example, in a case where the voltage at the node N3 is lower than the predetermined voltage Vc output from the predetermined voltage supply VG1, the comparator CMP1 outputs a comparison result of an L level. This comparison result of the L level is output to the control circuit CTL1 as a detection result indicating that an overvoltage has not been generated. In a case where the voltage at the node N3 is equal to or higher than the predetermined voltage Vc, the comparator CMP1 outputs a comparison result of an H level. This comparison result of the H level is output to the control circuit CTL1 as a detection result indicating that the overvoltage has been generated.

The overvoltage detection circuit DT1 is not limited to the circuit configuration illustrated in FIG. 2, but can be changed to another configuration having an equivalent function as appropriate.

As described above, the charge pump circuit 1 and the semiconductor system SYS1 including the same according to the present embodiment are provided with an overvoltage detection circuit for detecting an overvoltage generated by a power-supply fault of an output terminal of a driving control circuit that periodically switches a voltage applied to the capacitor element C1 of a boosting circuit. When the overvoltage has been detected by the overvoltage detection circuit, the charge pump circuit 1 and the semiconductor system SYS1 including the same according to the present embodiment control the transistors Tr1 and Tr2 provided in an output stage of the driving control circuit so that the transistors Tr1 and Tr2 are quickly turned off. By doing this, the charge pump circuit 1 and the semiconductor system SYS1 including the same according to the present embodiment can prevent deterioration of the transistors and a wiring caused by a flow of an overcurrent, for example. In particular, it is highly likely that an extremely large current flows through the transistor Tr2, and therefore it is very effective to detect an overvoltage of the power-supply line W1 and to quickly turn off the transistor Tr2.

In the present embodiment, a case is described as an example, in which the transistor Tr1 is turned off by setting the output of the gate driving circuit DR1 to be in the high-impedance state and the transistor Tr2 is turned off by setting the output of the gate driving circuit DR2 to be in the high-impedance state. However, the configuration is not limited thereto. A configuration may be employed in which the driving signal DS1 at the H level is output from the gate driving circuit DR1 to turn off the transistor Tr1 and the driving signal DS2 at the L level is output from the gate driving circuit DR2 to turn off the transistor Tr2. In this case, the resistor elements R1 and R2 are not required. However, when an abnormality has occurred, for example, the overvoltage has been detected, it is preferable to turn off the transistors Tr1 and Tr2 more surely by the resistor elements R1 and R2 that are provided separately from the driving circuits DR1 and DR2, for a case where the driving circuits DR1 and DR2 are damaged.

In addition, in the present embodiment, a case is described as an example, in which the overvoltage detection circuit DT1 monitors the voltage at the node N2 on the power-supply line W1 that couples the high-potential side voltage terminal T2 and the transistor Tr1 to each other, thereby detecting the overvoltage. However, the configuration of the overvoltage detection circuit DT1 is not limited thereto. The overvoltage detection circuit DT1 may be configured to directly monitor the voltage of the output terminal T3 to detect the overvoltage. In this case, it should be noted that the voltage of the output terminal T3 periodically changes.
(Modified Example of Semiconductor System SYS1)

Figure 3:
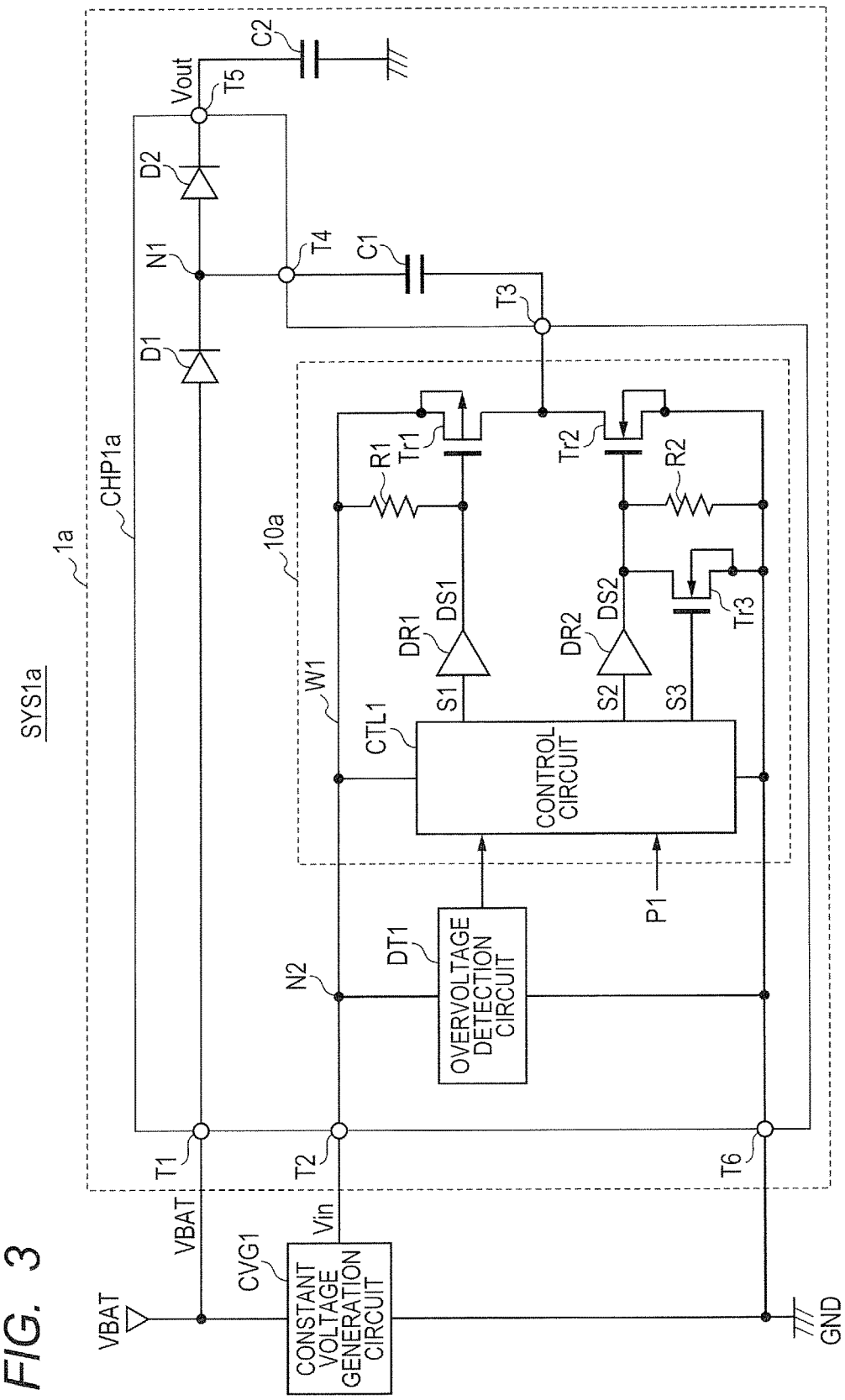
FIG. 3 illustrates a modified example of the semiconductor system illustrated in FIG. 1.

FIG. 3 illustrates a modified example of the semiconductor system SYS1 as a semiconductor system SYS1a. When being compared with the semiconductor system SYS1, the semiconductor system SYS1a includes a charge pump circuit 1a in place of the charge pump circuit 1. When being compared with the charge pump circuit 1, the charge pump circuit 1a further includes a transistor 3. A semiconductor chip 1a and a driving control circuit 10a in the charge pump circuit 1a respectively correspond to the semiconductor chip 1 and the driving control circuit 10 in the charge pump circuit 1.

Specifically, the transistor Tr3 is an N-channel MOS transistor and is provided between the gate and the source of the transistor Tr2.

The control circuit CTL1 not only controls turning-on/off of the transistors Tr1 and Tr2 but also controls turning-on/off of the transistor Tr3. In other words, the control circuit CTL1 outputs not only the control signals S1 and S2 for controlling turning-on/off of the transistors Tr1 and Tr2 but also a control signal S3 for controlling turning-on/off of the transistor Tr3. The control signal S3 is supplied to a gate of the transistor Tr3.

For example, in a boosting operation, the control circuit CTL1 outputs the control signal S3 at its L level to turn off the transistor Tr3. On the other hand, when an overvoltage has been detected, the control circuit CTL1 outputs the control signal S3 at its H level to turn on the transistor Tr3. This causes electric charges accumulated in the gate of the transistor Tr2 to be rapidly discharged to the low-potential side voltage terminal T6 via the transistor Tr3 in an on-state when an overvoltage of the power-supply line W1 has been detected. Therefore, the transistor Tr2 is quickly turned off. Accordingly, it is possible to prevent the transistor Tr2 and a wiring from being deteriorated or damaged by a flow of an overcurrent more effectively.

Other configurations of the charge pump circuit 1a and the semiconductor system SYS1a including the same are the same as the charge pump circuit 1 and the semiconductor system SYS1 including the same, and therefore the description thereof is omitted.

As described above, the charge pump circuit 1a and the semiconductor system SYS1a including the same according to the present embodiment further include the transistor Tr3 that is provided between the gate and the source of the transistor Tr2 and is turned on when an overvoltage has been detected. Due to this configuration, electric charges accumulated in the gate of the transistor Tr2 are rapidly discharged to the low-potential side voltage terminal T6 via the transistor Tr3 in the on-state when the overvoltage has been detected, and therefore the transistor Tr2 is quickly turned off. Consequently, deterioration of the transistor Tr2 and a wiring caused by a flow of an overcurrent can be prevented more effectively.

Second Embodiment

Figure 4:
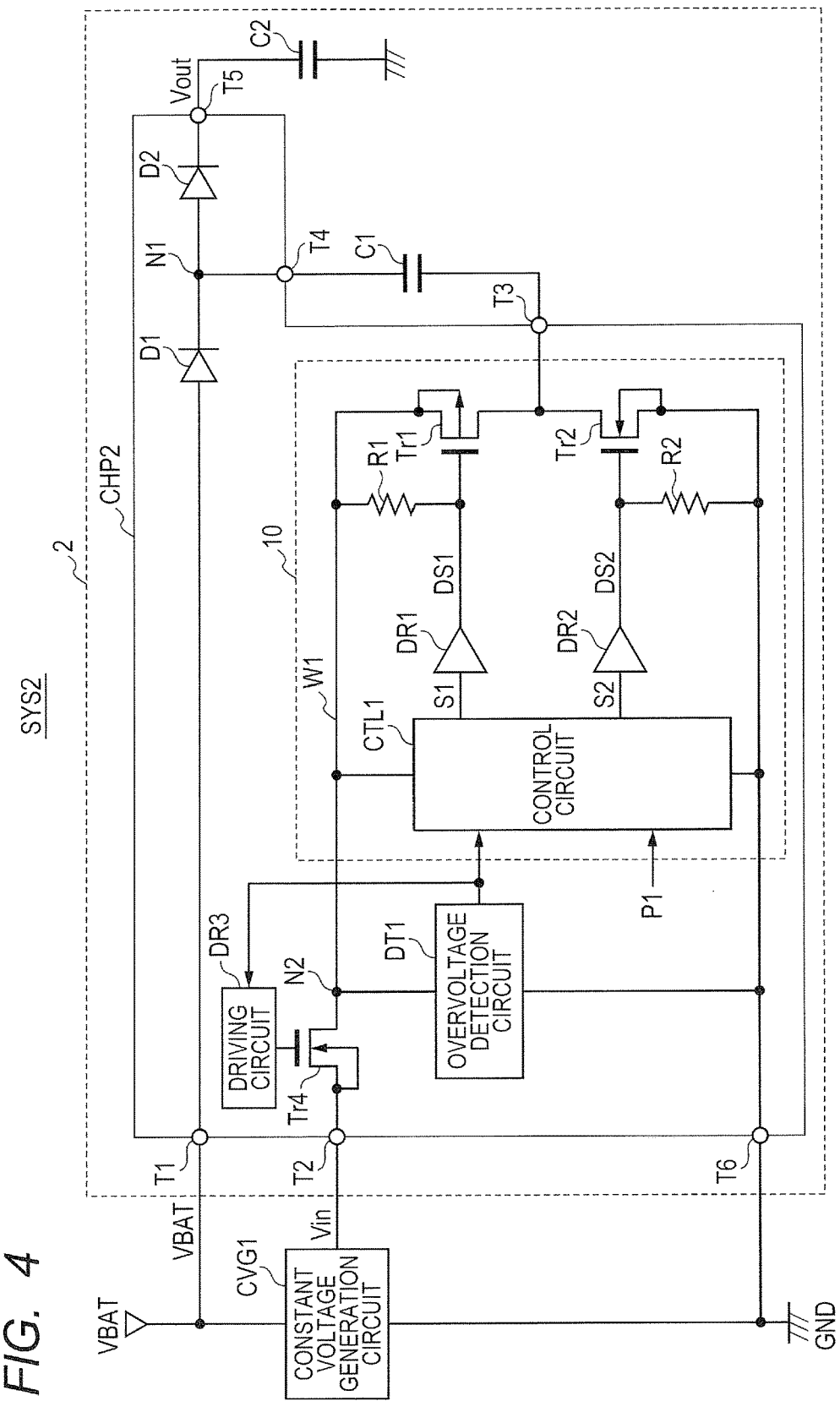
FIG. 4 illustrates a configuration example of a semiconductor system including a charge pump circuit according to a second embodiment.

FIG. 4 illustrates a configuration example of a semiconductor system SYS2 including a charge pump circuit 2 according to a second embodiment. When being compared with the semiconductor system SYS1, the semiconductor system SYS2 includes the charge pump circuit 2 in place of the charge pump circuit 1. When being compared with the charge pump circuit 1, the charge pump circuit 2 further includes a gate driving circuit DR3 and a transistor (a switching element) Tr4 on a semiconductor chip. A semiconductor chip CHP2 in the charge pump circuit 2 corresponds to the semiconductor chip CHP1 on the charge pump circuit 1.

Specifically, the transistor Tr4 is an N-channel MOS transistor that is different from the transistor Tr1 in a conductive type, and is provided on the power-supply line W1 between the node N2 on the power-supply line W1, to which the overvoltage detection circuit DT1 is coupled, and a high-potential side voltage terminal.

The gate driving circuit DR3 performs control to turn on the transistor Tr4 when an overvoltage has not been detected by the overvoltage detection circuit DT1, and performs control to turn off the transistor Tr4 when the overvoltage has been detected by the overvoltage detection circuit DT1.

By this control, it is possible to interrupt a path of a current that flows from the output terminal T3 to the high-potential side voltage terminal T2 via a parasitic diode of the transistor Tr1 and the power-supply line W1. Consequently, it is possible to not only prevent deterioration of the transistor Tr1 and the power-supply line W1 caused by a flow of an overcurrent but also to prevent the constant voltage generation circuit CVG1 from being broken by supply of the overcurrent. Further, in a case where the constant voltage Vin generated by the constant voltage generation circuit CVG1 is supplied to another circuit than the charge pump circuit 2, dielectric breakdown of the other circuit can be prevented.

During a time period in which a power-supply fault of the output terminal T3 occurs, a current continues to flow from the output terminal T3 towards the overvoltage detection circuit DT1 via the parasitic diode of the transistor Tr1 and the power-supply line W1. Therefore, the overvoltage detection circuit DT1 can continue to place the transistors Tr1 and Tr4 in their off-states.

(Modified Example of Semiconductor System SYS2)

Figure 5:
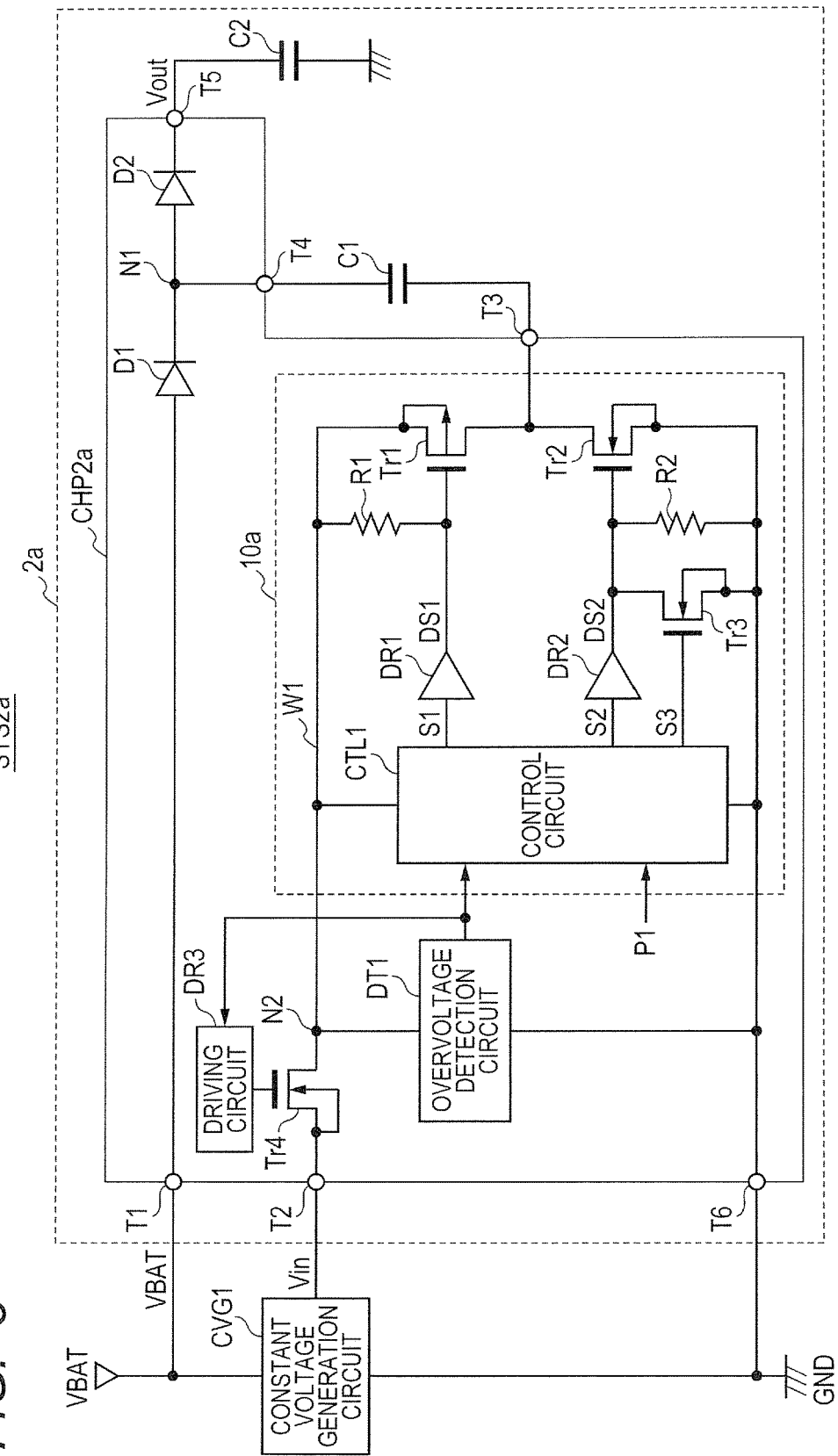
FIG. 5 illustrates a modified example of the semiconductor system illustrated in FIG. 4.

FIG. 5 illustrates a modified example of the semiconductor system SYS2 as a semiconductor system SYS2a. When being compared with the semiconductor system SYS2, the semiconductor system SYS2a includes a charge pump circuit 2a in place of the charge pump circuit 2. When being compared with the charge pump circuit 2, the charge pump circuit 2a further includes the transistor Tr3. A semiconductor chip CHP2a and a driving control circuit 10a in the charge pump circuit 2a respectively correspond to the semiconductor chip CHP2 and the driving control circuit 10 in the charge pump circuit 2.

Specifically, the transistor Tr3 is an N-channel MOS transistor, and is provided between the gate and the source of the transistor Tr2.

The details of the transistor Tr3 have been already described. In addition, other configurations of the charge pump circuit 2a and the semiconductor system SYS2a including the same are the same as those of the charge pump circuit 2 and the semiconductor system SYS2 including the same, and therefore the description thereof is omitted.

As described above, the charge pump circuit 2a and the semiconductor system SYS2a including the same according to the present embodiment further include the transistor Tr3 that is provided between the gate and the source of the transistor Tr2 and is turned on when an overvoltage has been detected. Due to this configuration, when the overvoltage has been detected, electric charges accumulated in the gate of the transistor Tr2 are rapidly discharged to the low-potential side voltage terminal T6 via the transistor Tr3 in its on-state, and therefore the transistor Tr2 is quickly turned off. Consequently, deterioration of the transistor Tr2 and a wiring caused by a flow of an overcurrent can be prevented further effectively.

As described above, the charge pump circuit and the semiconductor system including the same according to the above-described first and second embodiments include an overvoltage detection circuit for detecting an overvoltage generated by a power-supply fault of the output terminal T3 of a driving control circuit that periodically switches a voltage applied to the capacitor element C1 of a boosting circuit. When the overvoltage has been detected by the overvoltage detection circuit, the charge pump circuit and the semiconductor system including the same according to the first and second embodiments perform control to quickly turn off the transistors Tr1 and Tr2 provided in an output stage of the driving control circuit. Due to this configuration, the charge pump circuit 1 and the semiconductor system SYS1 including the same according to the present embodiment can prevent deterioration of the transistors and a wiring caused by a flow of an overcurrent, for example. In particular, because it is highly likely that an extremely large current flows through the transistor Tr2, it is very effective to detect the overvoltage of the power-supply line W1 and turn off the transistor Tr2 quickly.

Further, the charge pump circuit and the semiconductor system including the same according to the above-described first and second embodiments further include the transistor Tr3 that is provided between the gate and the source of the transistor Tr2 and is turned on when the overvoltage has been detected. Due to this configuration, electric charges accumulated in the gate of the transistor Tr2 are rapidly discharged towards the low-potential side voltage terminal T6 via the transistor Tr3 in its on state, when the overvoltage has been detected. Therefore, the transistor Tr2 is quickly turned off. Consequently, it is possible to prevent deterioration of the transistor Tr2 and the wiring caused by the flow of the overcurrent more effectively.

In the above description, the invention made by the inventors of the present application has been specifically described by way of the embodiments. However, the present invention is not limited to the aforementioned embodiments, and can be changed in various ways within the scope not departing from the gist thereof.

For example, in the semiconductor device according to the above-described embodiments, a conductive type (a p-type or an n-type) of a semiconductor substrate, a semiconductor layer, or a diffusion layer (a diffusion region) may be reversed. Therefore, assuming that one conductive type of the n-type and the p-type is a first conductive type and the other conductive type is a second conductive type, the first conductive type and the second conductive type may be the p-type and the n-type, or the n-type and the p-type, respectively.

What is claimed is:

1. A semiconductor device comprising:
    a first transistor provided between a high-potential side voltage terminal to which a constant voltage generated by reducing a power-supply voltage is supplied, and a first output terminal;
    a second transistor provided between a low-potential side voltage terminal to which a reference voltage is supplied, and the first output terminal;
    a control circuit that controls turning-on/off of the first and second transistors;
    a boosting circuit that boosts the power-supply voltage by using a voltage of the first output terminal, to generate an output voltage; and an overvoltage detection circuit that detects an overvoltage of a power-supply line coupling the high-potential side voltage terminal and the first transistor to each other, wherein the control circuit controls at least the second transistor in such a manner that the second transistor is turned off, when the overvoltage has been detected by the overvoltage detection circuit, wherein the semiconductor device further comprises:

a resistor element provided between a control terminal and a first terminal of the second transistor, the first terminal being provided on a side close to the low-potential side voltage terminal; and a third transistor provided in parallel to the resistor element, wherein the control circuit sets an output to the control terminal of the second transistor to be in a high-impedance state and controls the third transistor in such a manner that the third transistor is turned on, when the overvoltage has been detected by the overvoltage detection circuit.

2. The semiconductor device according to claim 1, further comprising a third transistor provided between a control terminal and a first terminal of the second transistor, the first terminal being provided on a side close to the high-potential side voltage terminal, wherein the control circuit further controls the third transistor in such a manner that the third transistor is turned on, when the overvoltage has been detected by the overvoltage detection circuit.

3. The semiconductor device according to claim 1, wherein the control circuit performs control in such a manner that the second transistor is turned off and the first transistor is turned off, when the overvoltage has been detected by the overvoltage detection circuit.

4. The semiconductor device according to claim 1, wherein the boosting circuit includes first and second diodes that are provided in a forward direction from a voltage input terminal to which the power-supply voltage is supplied from an outside, to a voltage output terminal that outputs the output voltage to the outside, and wherein a voltage of the first output terminal is applied to a node between the first and second diodes via a capacitor element.

5. A charge pump circuit comprising:

the semiconductor device according to claim 4, and the capacitor element that is provided between a node between the first and second diodes, and the first output terminal.

6. A semiconductor system comprising:

the charge pump circuit according to claim 5, and a constant voltage generation circuit that reduces the power-supply voltage to generate a constant voltage.

7. A vehicle comprising the semiconductor system according to claim 6, wherein the power-supply voltage is used by the charge pump circuit and a peripheral circuit other than the charge pump circuit.

8. The semiconductor device comprising:

a first transistor provided between a high-potential side voltage terminal to which a constant voltage generated by reducing a power-supply voltage is supplied, and a first output terminal;

a second transistor provided between a low-potential side voltage terminal to which a reference voltage is supplied, and the first output terminal;

a control circuit that controls turning-on/off of the first and second transistors;

a boosting circuit that boosts the power-supply voltage by using a voltage of the first output terminal, to generate an output voltage; and an overvoltage detection circuit that detects an overvoltage of power-supply line coupling the high-potential side voltage terminal and the first transistor to each other, wherein the control circuit controls at least the second transistor in such a manner that the second transistor is turned off, when the overvoltage has been detected by the overvoltage detection circuit, wherein the semiconductor device further comprises a switching element that is provided on the power-supply line and is turned off when the overvoltage has been detected by the overvoltage detection circuit, and wherein the switching element is provided on the power-supply line between a node on the power-supply line, to which the overvoltage detection circuit is coupled, and the high-potential side voltage terminal.

9. The semiconductor device according to claim 8, wherein the switching element is an MOS transistor with a conductive type different from that of the first transistor.

10. The semiconductor device according to claim 8, further comprising a third transistor provided between a control terminal and a first terminal of the second transistor, the first terminal being provided on a side close to the high-potential side voltage terminal, wherein the control circuit further controls the third transistor in such a manner that the third transistor is turned on, when the overvoltage has been detected by the overvoltage detection circuit.

11. The semiconductor device according to claim 8, wherein the control circuit performs control in such a manner that the second transistor is turned off and the first transistor is turned off, when the overvoltage has been detected by the overvoltage detection circuit.

12. The semiconductor device according to claim 8, wherein the boosting circuit includes first and second diodes that are provided in a forward direction from a voltage input terminal to which the power-supply voltage is supplied from an outside, to a voltage output terminal that outputs the output voltage to the outside, and wherein a voltage of the first output terminal is applied to a node between the first and second diodes via capacitor element.

13. A charge pump circuit comprising:

the semiconductor device according to claim 12, and the capacitor element that is provided between a node between the first and second diodes, and the first output terminal.

14. A semiconductor system comprising:

the charge pump circuit according to claim 13, and a constant voltage generation circuit that reduces the power-supply voltage to generate a constant voltage.

15. A vehicle comprising the semiconductor system according to claim 14, wherein the power-supply voltage is used by the charge pump circuit and a peripheral circuit other than the charge pump circuit.

16. A control method of a semiconductor device, comprising the steps of:

controlling turning-on/off of a first transistor that is provided between a high-potential side voltage terminal to which a constant voltage generated by reducing a power-supply voltage is supplied and a first output terminal, and a second transistor that is provided between a low-potential side voltage terminal to which a reference voltage is supplied and the first output terminal, to periodically switch a voltage of the first output terminal to the constant voltage or the reference voltage;

boosting the power-supply voltage by using the voltage of the first output terminal to generate an output voltage; and controlling at least the second transistor in such a manner that the second transistor is turned off, when an overvoltage of a power-supply line that couples the high-potential side voltage terminal and the first transistor to each other has been detected, wherein the semiconductor device comprises:

a resistor element provided between a control terminal and a first terminal of the second transistor, the first terminal being provided on a side close to the low-potential side voltage terminal; and a third transistor provided in parallel to the resistor element, and wherein the method further comprises setting, by a control circuit, an output to the control terminal of the second transistor to be in a high-impedance state and controls the third transistor in such a manner that the third transistor is turned on, when the overvoltage has been detected by the overvoltage detection circuit.

* * * * *